United States Patent
Yamakawa et al.

(10) Patent No.: US 8,007,690 B2
(45) Date of Patent: Aug. 30, 2011

(54) CONDUCTIVE PASTE AND WIRING BOARD USING IT

(75) Inventors: Masahiro Yamakawa, Osaka (JP); Kohei Shimoda, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 999 days.

(21) Appl. No.: 11/887,835

(22) PCT Filed: May 22, 2006

(86) PCT No.: PCT/JP2006/310171
§ 371 (c)(1),
(2), (4) Date: Oct. 4, 2007

(87) PCT Pub. No.: WO2006/126499
PCT Pub. Date: Nov. 30, 2006

(65) Prior Publication Data
US 2009/0107707 A1   Apr. 30, 2009

(30) Foreign Application Priority Data
May 25, 2005   (JP) .................. 2005-152608

(51) Int. Cl.
*H01B 1/22* (2006.01)
(52) U.S. Cl. .................. 252/512; 252/514; 174/257
(58) Field of Classification Search .................. 174/257; 252/512, 514
See application file for complete search history.

(56) References Cited

U.S. PATENT DOCUMENTS

| | | | |
|---|---|---|---|
| 5,250,229 A | 10/1993 | Hara et al. | |
| 5,376,596 A * | 12/1994 | Tokuda et al. | 501/19 |
| 6,174,344 B1 * | 1/2001 | Hayashi et al. | 75/255 |
| 6,265,090 B1 | 7/2001 | Nishide et al. | |
| 6,391,087 B1 | 5/2002 | Hayashi et al. | |
| 7,267,713 B2 * | 9/2007 | Adachi | 106/13 |
| 7,556,747 B2 * | 7/2009 | Yamakawa et al. | 252/512 |
| 2004/0124400 A1 * | 7/2004 | Nagai et al. | 252/500 |
| 2007/0080329 A1 * | 4/2007 | Nomiya et al. | 252/500 |

FOREIGN PATENT DOCUMENTS

| | | |
|---|---|---|
| EP | 0 962 977 A2 | 12/1999 |
| EP | 1 684 559 A1 | 7/2006 |
| JP | 01-265405 | 10/1989 |
| JP | 04-065011 | 3/1992 |

(Continued)

OTHER PUBLICATIONS

International Preliminary Report on Patentability and Written Opinion of The International Searching Authority issued in International Application No. PCT/JP2006/310171, dated Dec. 13, 2007.

(Continued)

*Primary Examiner* — Angel R Estrada
*Assistant Examiner* — Dimary Lopez
(74) *Attorney, Agent, or Firm* — McDermott Will & Emery LLP

(57) ABSTRACT

A conductive paste mainly composed of a metal powder, a glass frit, and an organic vehicle. The total content amount of the metal powder and glass frit with respect to the entire conductive paste is 85 wt % or more. The viscosity at a rotational speed of 1 rpm measured at 25° C. with an E type rotating viscometer is 100 Pa·s or more and 400 Pa·s or less.

8 Claims, 1 Drawing Sheet

(Before Sintering)   (After Sintering)

FOREIGN PATENT DOCUMENTS

| | | |
|---|---|---|
| JP | 4-277406 | 10/1992 |
| JP | 8-306228 | 11/1996 |
| JP | 10-330801 | 12/1998 |
| JP | 2004-039379 | 2/2004 |
| JP | 2004-139838 | 5/2004 |
| JP | 2006-196246 | 7/2006 |

OTHER PUBLICATIONS

European Office Action issued in European Patent Application No. EP 06 74 6705, dated May 19, 2009.

* cited by examiner

CONDUCTIVE PASTE AND WIRING BOARD USING IT

RELATED APPLICATIONS

This application is the U.S. National Phase under 35 U.S.C. §371 of International Application No. PCT/JP2006/310171, filed on May 22, 2006, which in turn claims the benefit of Japanese Application No. 2005-152608, filed on May 25, 2005, the disclosures of which Applications are incorporated by reference herein.

FIELD OF THE INVENTION

The present invention relates to conductive paste for use in forming a wiring circuit on a substrate and a wiring board obtained using the same conductive paste.

BACKGROUND OF THE INVENTION

The conductive paste containing mainly metal powder as solid content has been widely used in electronic device components since it shows excellent conductive properties and for example, is used as material for an electrically-conductive path when forming an electric circuit on a wiring board. As this conductive paste, a conductive paste produced in a paste state by dispersing, for example metal powder and glass frit, in an organic vehicle is available. Then, the conductive paste is applied to a ceramic, glass substrate or the like by screen printing or the like so as to form a wiring pattern. Next, when the conductive paste is sintered at high temperatures, the organic vehicle is transpired and the metal powder is sintered so as to form a continuous film. Such conductive paste provides excellent conductive properties since the metal powder is sintered to form the continuous film.

To achieve high density in electronic device components using the conductive paste, fine wiring patterns (or fine patterns) need to be formed efficiently. Patent Document 1 has disclosed a conductive paste for improving the accuracy of fine pattern to be formed.

Patent Document 1 discloses a conductive paste in which the viscosity ($V_{1rpm}$) under a rotational speed of rotations of 1 rpm measured using a No. 4 spindle of a Brookfield rotating viscometer is 200 Pa·s or more, and the ratio ($V_{1rpm}/V_{10rpm}$) between viscosity $V_{1rpm}$ under a rotational speed of 10 rpm and viscosity $V_{10rpm}$ is 2-5. The use of the conductive paste having such viscosity characteristics makes it hard for conductive paste applied in a predetermined pattern to droop down, thereby securing excellent shape maintainability. In this conductive paste, the ratio of conductive power occupying the conductive paste is preferably 80-95 wt %. Also, the use of such conductive paste improves the shape accuracy of the fine pattern without degrading handleability and printability of the conductive paste.

Patent document 1: Japanese Laid-Open Patent Publication No. 2004-139838

SUMMARY OF THE INVENTION

Generally, sintering type paste for use in wiring is demanded to suppress wiring resistance to a low level. Although enlarging wiring width is effective to suppress the wiring resistance to a low level, it is often difficult in design to enlarge the wiring width and rather, there is a strong demand for narrowing the wiring width. Therefore, to suppress the wiring resistance to a low level, it is necessary to apply conductive paste thickly as well as to lower the volume resistivity of the conductive paste. The conductive paste needs to be sintered sufficiently to obtain high conductive properties and generally, contraction of the conductive paste at the time of drying and sintering is large, so that the thickness after sintering contracts to about 20% of the thickness at the time of application. Thus, to suppress contraction at the time of drying and sintering, the content of metal powder and glass frit with respect to the entire conductive paste needs to be increased.

However, if the content of metal powder and glass frit with respect to the entire conductive paste is increased, the viscosity of conductive paste is increased. Thus, when the wiring pattern is formed on a wiring board by screen printing, the discharge rate of the conductive paste through an opening of a screen print plate decreases. As a result, it is difficult to apply conductive paste thickly.

When the content of the metal powder and the glass frit with respect to the entire conductive paste is lowered to reduce the viscosity of the conductive paste, contraction thereof at the time of drying and sintering is intensified further although the discharging performance of the conductive paste is improved. Consequently, the conductive paste cannot be easily applied thickly.

Accordingly, it is an objective of the present invention to provide a conductive paste which improves the discharging performance of the conductive paste and suppresses contraction at the time of drying and sintering effectively to ensure thick application thereof, and a wiring board using it.

To achieve the above-described objective, according to one aspect of the present invention, a conductive paste mainly composed of a metal powder, a glass frit, and an organic vehicle is provided. The total amount of contents of the metal powder and the glass frit with respect to the entire conductive paste is 85 wt % or more. The viscosity at the number of rotation of 1 rpm measured at 25° C. with an E type rotating viscometer is 100 Pa·s or more and 400 Pa·s or less.

With this composition, contraction of applied film at the time of drying and sintering of conductive paste can be suppressed effectively. When wiring pattern is formed by screen printing, the discharging performance of conductive paste can be improved. Thus, the conductive paste can be applied thick.

Preferably, the total amount of contents of the metal powder and the glass frit with respect to the entire conductive paste is 90 wt % or more. With this composition, contraction of applied film at the time of drying and sintering of conductive paste can be suppressed further effectively, so that the conductive paste can be easily applied thickly.

When the BET specific surface area ($m^2/g$) of the metal powder is expressed as BET, the BET and the tap density ($g/cm^3$) of the metal powder satisfy the relationship of tap density $\geq$ 5-BET. With this composition, when conductive paste is prepared, dispersibility of the metal powder is improved and the packing density of the metal powder is improved, so that the conductive paste can be easily applied thickly. Since increased viscosity of the conductive paste can be suppressed, even if the total amount of content of the metal powder and glass frit with respect to the entire conductive paste is high, the discharging performance of the conductive paste is never lowered, thereby effectively suppressing contraction of the applied film at the time of drying and sintering.

Preferably, the metal powder contains substantially spherical particles of which the primary particle average diameter is 50 nm or less. The blending quantity of the substantially spherical particles is 1-50 wt % with respect to the aforementioned entire metal powder. With this composition, the packing density of metal powder is improved and thus, the conductive property can be improved at a low sintering temperature (for example 550° or less) and further, conductive paste can be applied thickly. Preferably, the metal powder is made of one or more of platinum, gold, copper, silver, nickel and palladium. Alternatively, the metal powder is an alloy of one or more of these metals and other metal.

The organic vehicle is constituted of a solvent having a boiling point of 200° C. or higher and a resin soluble in the solvent. With this composition, since the boiling point of the solvent for use is high, when the wiring pattern is formed by screen printing, desiccation tolerance of the conductive paste is improved and the screen plate becomes unlikely to be clogged. Therefore, formation accuracy of the wiring pattern at the time of continuous printing can be improved.

According to another aspect of the present invention, a wiring board having a substrate and a wiring formed on the a substrate by printing with the aforementioned conductive paste is provided. With this composition, since the aforementioned conductive paste is used, a wiring board in which wiring having high conductive property is formed on a substrate thereof can be obtained. Preferably, the thickness of the wiring is 25 μm or more.

DESCRIPTION OF THE PREFERRED EMBODIMENTS

Figure 1:
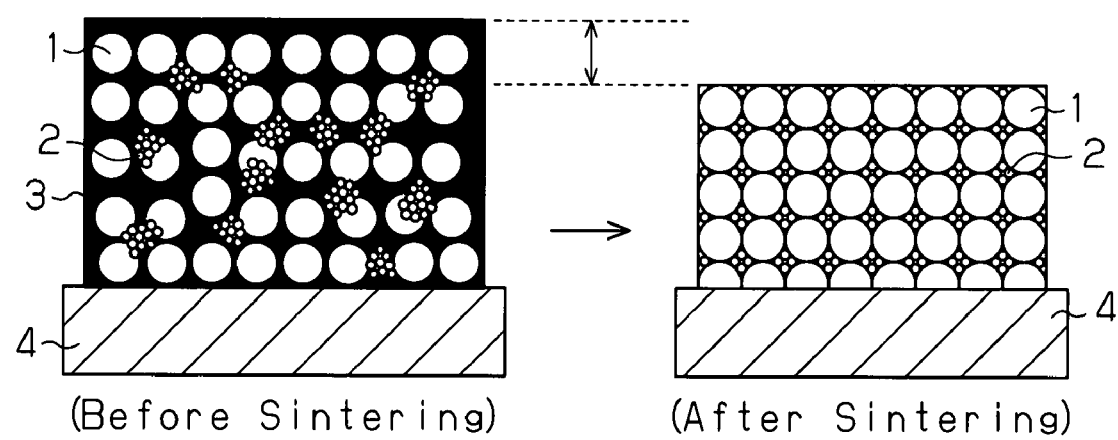
FIG. 1 is a conceptual diagram showing behavior of a conductive paste when sintered.

Hereinafter, preferred embodiments of the present invention will be described.

A conductive paste of the present invention is mainly composed of a metal powder, a glass frit and an organic vehicle. As the metal powder, for example, substantially spherical particles having a primary particle average diameter of 0.1 μm or more and 5 μm or less is used. The average particle diameter mentioned here indicates 50% particle diameter ($D_{50}$) and is measured, for example, with a particle size distribution measuring device which employs the laser Doppler method (manufactured by NIKKISO CO., LTD, NANOTRACK (registered trademark) particle size distribution measuring device UPA-EX150). The substantially spherical particle generally refers to not only a particle having a completely spherical shape but also a particle having slight unevenness on its surface and a particle having an elliptical section.

The viscosity ($V_{1rpm}$) at a rotational speed of 1 rpm of the conductive paste of the present invention, measured at 25° C. with an E type rotating viscometer of rotor No. 7 is 100 Pa·s or more and 400 Pa·s or less, preferably 150 Pa·s or more and 300 Pa·s or less. If the aforementioned viscosity of the conductive paste is excessively high, when the conductive paste is screen-printed, discharging performance of the conductive paste is worsened. On the other hand, if the aforementioned viscosity of the conductive paste is excessively low, applied conductive paste droops down easily. That is, by setting the viscosity of the conductive paste in the aforementioned range, the discharging performance of the conductive paste when the conductive paste is printed can be improved. As a result, the conductive paste can be applied thickly.

The ratio between the viscosity of conductive paste at a rotational speed of 1 rpm measured at normal temperature (25° C.) with the E type rotating viscometer of rotor No. 7 and the viscosity ($V_{10rpm}$) of conductive paste at a rotational speed of 10 rpm ($V_{1rpm}/V_{10rpm}$) is, preferably, 2 or more and 6 or less. If the viscosity ($V_{10rpm}$) at a rotational speed of 10 rpm is lowered in such a range of the viscosity ratio, when the conductive paste is screen-printed, the discharging performance of the conductive paste is improved. When the viscosity ($V_{1rpm}$) at a rotational speed of 1 rpm in the above-mentioned range of the viscosity (100 Pa·s or more to 400 Pa·s or less), the applied conductive paste does not droop easily. Thus, the formation accuracy of a wiring pattern can be improved with optimum leveling performance maintained, which improves the printability thereof.

The viscosity and viscosity ratio can be adjusted depending on the kind of solvent constituting the organic vehicle, kind of resin constituting the organic vehicle, compounding ratio of these, and the content of the organic vehicle with respect to the entire conductive paste.

To apply conductive paste thickly while suppressing contraction at the time of drying and sintering effectively, the solid component content (metal powder and glass frit) in the conductive paste needs to be intensified. Thus, the total amount of the content of metal powder and glass frit with respect to the entire conductive paste is 85 wt % or more, preferably 90 wt % or more.

Generally, in a conductive paste mainly composed of metal powder, glass frit and organic vehicle, the packing density of metal powder affects the conductive property. That is, as the packing density of metal powder increases, an elaborate sintered coating film can be obtained, and if more conductive paths are formed through the metal powder, the conductive properties of the conductive paste can be improved.

If the packing density of the metal powder is increased, the conductive paste can be applied thickly. FIG. 1 is a conceptual diagram showing behavior of the conductive paste at the time of sintering. The conductive paste before sintering contains a metal powder 1, a glass frit 2, and an organic binder 3. In a process of sintering by heating, the organic binder 3 is removed and the glass frit 2 flows so that the metal powder 1, and the metal powder 1 and a substrate 4 adhere to each other. Then, the metal powder 1 is sintered together so that the applied film is contracted. If the packing density of the metal powder 1 is high, the contraction amount of this applied film can be reduced. This allows the applied film to be formed thickly.

When the BET specific surface area ($m^2/g$) of metal powder is expressed as BET in the present invention, the BET and tap density ($g/cm^3$) of metal powder are preferred to satisfy the relationship of tap density $\geq$ 5-BET. With such a composition, when a conductive paste is produced, the dispersibility of the metal powder is improved and the packing density of the metal powder is improved, so that the applied film can be formed thickly. Further, rise in the viscosity of the conductive paste can be suppressed. Thus, if the total amount of the contents of the metal powder and the glass grit with respect to the entire conductive paste is 85 wt % or more, the contraction thereof at the time of drying and sintering can be suppressed effectively without a drop in the discharging performance of the conductive paste.

The tap density serves as an evaluation index for the packing characteristic of metal powder. As the tap density is increased, the metal powder fills more elaborately. This tap density is calculated by vibrating powder of a specified quantity contained in a container until volume decrease thereof does not occur any more in accordance with "Metallic powders—Determination of tap density" of ISO 3953-1985(E), which is an international standard, and after that dividing the weight of the powder by its powder volume after the above test.

The lower limit of the tap density is preferably in the range expressed by tap density $\geqq 4$ (g/cm$^3$), from viewpoints of improving the dispersibility and packing density of the metal powder.

Preferably, the BET specific surface area of the metal powder is 0.1 m$^2$/g or more. If the BET specific surface area of the metal powder is 0.1 m$^2$/g or more, the dispersibility of substantially spherical particles for use is improved and the dispersion of substantially spherical particles in the conductive paste is equalized so as to suppress increase in local volume resistance, thereby improving the conductive property. The upper limit of the BET specific surface area is not restricted to any particular one, but is preferably 3 m$^2$/g or less. If the BET specific surface area exceeds 3 m$^2$/g, the average particle diameter of the substantially spherical particles becomes excessively small, so that it is difficult to handle the metal powder without any aggregation.

In the present invention, it is permissible to use metal powder in which substantially spherical particles of two or more kinds having different sizes in a mixed state at a specified ratio. For example, the metal powder may be formed by mixing plural kinds of the substantially spherical particles having different average particle diameters on the condition that the primary particles (hereinafter referred to as "substantially spherical particles (A)") is in a range of 0.1 μm or more and 5 μm or less in the average particle diameter of the primary particles. Further, the metal powder may be formed by mixing the substantially spherical particles (A) with substantially spherical particles having an average particle diameter of 50 nm or less in terms of the primary particle (hereinafter referred to as "substantially spherical particle (B)").

The substantially spherical particles (A) of the present invention are obtained according to, for example, the wet reduction method and atomizing method. On the other hand, the substantially spherical particles (B) are obtained by subjecting metal compound to the wet reduction treatment. More specifically, the substantially spherical particles (B) are obtained by adding water soluble metal compound into water or mixture of water and lower alcohol, and after that, adding an aqueous solution in which a reducing compound and surface preparation agent are dissolved further, and then agitating it at temperatures of 30° C. or less.

If silver powder is used as the metal powder, silver nitrate is dissolved in a liquid in which pure water and ethanol are mixed by equal quantities and ammonia water is added so as to adjust pH to 11.3 so as to obtain transparent silver nitrate solution. Next, L-ascorbic acid as a reducing compound and polyacrylic acid as a dispersing agent are dissolved in the solution in which pure water and ethanol are mixed by equal quantities. The reason for using of the dispersing agent is to control progress of precipitation reaction of silver fine particles which are precipitated by reduction reaction mildly so as to prevent plural fine particles from being aggregated to larger particles. Next, with the solution in which reducing compound and dispersing agent are dissolved maintained at 25° C. and agitated, the silver nitrate produced previously is dripped gradually so as to precipitate silver fine particles and then, by washing and collecting the fine particles, spherical silver particles having an average particle diameter of 30 nm can be obtained. As for other metal powders, finer metal powders can be obtained in the same operation.

When a metal powder in which two kinds of substantially spherical particles (A) and (B) having different sizes are mixed at a specified ratio is used, the substantially spherical particles (B) are not dispersed around the substantially spherical particles (A) if the content of the substantially spherical particles (B) with respect to the entire metal powder is less than 1 wt %, so that sometimes no sufficient conductive paths are formed at the time of sintering. On the other hand, if the content of the substantially spherical particles (B) exceeds 50 wt %, the substantially spherical particles (B) surround the substantially spherical particles (A) completely. Consequently, although the conductive property can be improved sufficiently, the manufacturing costs are increased since the usage amount of the substantially spherical particles (B) is large. Therefore, preferably the content of the substantially spherical particles (A) with respect to the entire metal powder is 50-99 wt % and preferably, the content of the substantially spherical particles (B) is 1-50 wt %. Further, more preferably, the content of the substantially spherical particles (A) with respect to the entire metal powder is 90-97 wt % and more preferably, the content of the substantially spherical particles (B) is 3-10 wt %.

With such a composition, the substantially spherical particles (B) having a small particle size of 50 nm or less are packed between the substantially spherical particles (A) having a relatively large particle size, so that the packing density of the metal powder is increased. Consequently, the conductive property at a low sintering temperature (for example, 550° C. or less) can be improved and the conductive paste can be applied thick. Further, by using the substantially spherical particles (A) and the substantially spherical particles (B) in the above-mentioned range of the content, the manufacturing costs can be suppressed.

Generally, when the aforementioned viscosity or viscosity ratio is adjusted, an additive such as a thixotropy agent is used. However, in the present invention, the substantially spherical particles (B) having an excellent dispersibility, a large specific surface area and a primary particle average particle diameter of 50 nm or less act as the thixotropy agent. Thus, in the present invention, the necessity of using the additive inferior in conductive property to metal powder is eliminated by using of the substantially spherical particles (B). Thus, the viscosity or viscosity ratio can be adjusted without reducing the conductive property of the entire conductive paste. That is, the viscosity at a rotational speed of 10 rpm can be reduced while the viscosity at a rotational speed of 1 rpm can be increased.

The glass frit is a binder for use in improving adhesion force between a formed pattern and a substrate. Although the blending quantity of the glass frit may be minute, preferably the content of the glass frit is 0.1 wt % or more and 15 wt % or less with respect to the total amount of the metal powder and the glass frit since the adhesion force between conductive paste and substrate is secured.

The point of operation of the glass frit serves as an index for the temperature of the glass frit's melting and dispersion, and is preferably 520° C. or less since, if set equal to or less than 520° C., the point of operation lowers the sintering temperature so as to enable both low temperature sinterability and a high conductive property. The point of operation of the present invention refers to a temperature under which the glass frit is softened when its temperature is raised by heating, so that a predetermined viscosity (about $10^4$ Pa·s) is reached.

The average particle diameter of the glass frit is not restricted to any particular size, but is preferably 0.3 μm or more and 5 μm or less. If the average particle diameter of the glass frit exceeds 5 μm, dispersibility of the metal powder and glass frit is worsened. If the average particle diameter of glass frit is less than 0.3 μm, secondary aggregation of the glass frit occurs and the dispersibility of the glass frit drops. Sintering is thus carried out unevenly in some cases. Using of the glass frit, of which the average particle diameter is in the aforementioned range, enables high conductive property to be obtained since the glass frit is hard to segregate and the dispersibility thereof in the conductive paste is excellent.

The kind of the glass frit can be selected from marketed ones. It is preferable to use a glass frit containing no lead from viewpoints of environmental concern. As the glass frit free of lead, preferably, bismuth base or zinc base material may be used.

The organic vehicle for use in the present invention is a mixture of resin and solvent. The organic vehicle is demanded to have a characteristic of maintaining a state in which metal powder and glass frit are mixed equally. Further, the organic vehicle is demanded to have a characteristic of homogenizing the conductive paste when the conductive paste is applied to a substrate by screen-printing so as to prevent blur and flow of a print pattern and improving the discharging performance and the separability of the conductive paste from a screen plate. Thus, from viewpoints of characteristic maintenance, preferably, an organic vehicle produced by dissolving cellulose base resin or acrylic base resin in solvent is used. More specifically, ethyl cellulose and nitro cellulose is preferable as resin and ethyl cellulose is particularly preferable from viewpoints of safety, stability and the like. These resins may be mixed with each other. From viewpoints of maintenance of the characteristic, preferably, the content of ethyl cellulose with respect to the entire resin components dissolved in solvent constituting the organic vehicle is 60 wt % or more, and more preferably, 80 wt % or more and 100 wt % or less.

As described above, the viscosity and viscosity ratio of the conductive paste can be adjusted with a resin constituting an organic vehicle.

If the resin is soluble and noncorrosive to the substrate on which the conductive paste is applied and a solvent having a low volatility is used, the desiccation tolerance of the conductive paste is improved and the print workability is improved. Thus, from viewpoints of characteristic maintenance, as the solvent, organic solvents, for example, butyl carbitol, butyl carbitol acetate, terpineol, diethylene glycol monoethyl ether acetate and diethyl phthalate are preferable. When a pattern is formed by screen printing, organic solvents having a boiling point of 200° C. or higher and hard to volatilize, for example, diethylene glycol monoethyl ether acetate, butyl carbitol acetate and terpineol are preferable. Since using of such solvents having a high boiling point improves desiccation tolerance of the conductive paste and makes it difficult for a screen plate to clog, for example, when a wiring pattern is formed by screen printing, the formation accuracy of the wiring pattern at the time of continuous printing can be improved.

The content of the organic vehicle with respect to the entire conductive paste is not restricted to any particular one but may be adjusted appropriately corresponding to a printing method for screen printing or the like. When a wiring pattern is formed by screen printing, an organic vehicle in which ethyl cellulose having molecular weight of 10000-20000 is dissolved in diethylene glycol monoethyl ether acetate, for example, at a ratio of 5-20 wt % can be used.

In the present invention, various kinds of additives such as thixotropy agent, leveling agent, plasticizer, which are used as conductive paste conventionally, may be used to adjust Theological behavior of the conductive paste. For example, at the time of continuous printing by the screen print, the desiccation tolerance of the conductive paste is an important characteristic, and by adding plasticizer, the desiccation tolerance of the conductive paste can be improved.

The conductive paste of the present invention is suitably used when a wiring having a high conductive property or an electric circuit such as an electrode is formed on a substrate (a glass substrate or the like). More specifically, the conductive paste of the present invention is applied to a substrate according to a known printing method (a screen printing method is particularly preferable) so as to form a wiring pattern. Next, by sintering the conductive paste at high temperatures, metal powder is sintered together so that a desired wiring or electric circuit such as an electrode is formed on the substrate so as to obtain a wiring board.

The conductive paste of the present invention has excellent characteristics in that the contraction of applied film when the conductive paste is dried or sintered can be suppressed effectively and the discharging performance of the conductive paste can be improved. Thus, when manufacturing a wiring board having plural wirings on a substrate, the conductive paste of the present invention can be suitably used to form a wiring pattern having high conductive properties and a thickness of 25 μm or more.

EXAMPLES

Hereinafter, the present invention will be described with reference to Examples and Comparative Examples. The present invention is not restricted to these examples, but these examples may be modified or changed based on the spirit of the present invention while such modifications and changes are not excluded from the scope of the present invention.

Examples 1-5

As an organic vehicle, ethyl cellulose (molecular weight of 15000) was dissolved in diethylene glycol monoethyl ether acetate by heating so as to prepare a solution having resin content density of 6, 8 or 10 wt %. Next, silver powder was added to the solution as the metal powder and mixed homogeneously with a rotating agitation defoaming apparatus and further, a glass frit was added and the mixing was continued. After it was determined by visual check that these components were uniform, the solution was passed through a 3-roll mill so as to prepare conductive pastes shown in Examples 1-5 of Table 1 below. No abnormality on appearance in normal condition was observed in the conductive pastes of Examples 1-5. Table 1 shows the kinds and blending quantity of the respective components in Example 1-5.

In Examples 1-5, the total amount of the contents of silver powder and glass frit with respect to the entire conductive paste was 91 wt %. As the result of measurement with an automatic specific surface area measuring device (manufactured by MALVERN, GEMINI 2375), the BET specific surface area of silver powder used in production of Examples 1-3 were 0.3 m$^2$/g, while those of Examples 4, 5 were 1.1 m$^2$/g. As the result of calculating according to "Metallic powders—Determination of tap density" of ISO 3953-1985(E), the tap density of silver powder used in production of Examples 1-3 were 5.0 g/cm$^3$, while those of Examples 4, 5 were 5.2 g/cm$^3$.

Next, the viscosity of each conductive paste at a rotational speed of rotations of 1 rpm was measured. More specifically, the viscosity was measured at a normal temperature (25° C.) using a rotor No. 7 of E type rotating viscometer (manufactured by TOKI SANGYO CO., LTD., TV-20 type viscometer cone-plate type (TVE-20H)).

Subsequently, conductive paste samples of Examples 1-5 were applied to a glass substrate (manufactured by ASAHI GLASS CO., LTD., PD200) in width of 50 mm×length of 100 mm using a doctor blade so as to form films, and the thickness of each film was measured. The glass substrate was put in a normal temperature bath and heated at 150° C. for 30 minutes to volatilize solvent for drying and the film thickness was measured. After that, the glass substrate was transferred to a sintering furnace at a sintering temperature of 500° C. and heated for 30 minutes. After sintering, film thickness and volume resistance were measured to evaluate conductive properties. A film thickness at the time of application of the solvent was measured using a wet film thickness meter (manufactured by COTEC CO., LTD, E-3230-4). Film thicknesses after drying and sintering were measured using a surface roughness measuring device (manufactured by TOKYO SEIMITSU CO., LTD., SURFCOM130A). Then, a contraction percentage of applied film at the time of drying and sintering of conductive paste was calculated according to a following equation.

Contraction percentage of applied film at the time of drying=100 (1−film thickness after drying/film thickness at the time of application)

Contraction percentage of applied film at the time of sintering=100 (1−film thickness after sintering/film thickness at the time of application)

A resistance was measured according to 4-terminal method and the cross section of a line was measured with a laser microscope (manufactured by KEYENCE, VK-8510) so as to calculate its volume resistivity. The state of film formed when conductive paste was applied to a glass substrate using a doctor blade visually was visually observed, and the film forming property of each conductive paste of Examples 1-5 was evaluated to be excellent.

Next, a predetermined pattern was printed on a glass substrate (manufactured by ASAHI GLASS CO., LTD, PD200) with a screen printing machine (manufactured by NEWLONG SEIMITSU KOGYO CO., LTD., LS-150TVA) using conductive paste of Examples 1-5 so as to form wiring. In this screen printing, a screen plate (manufactured by TOKYO PROCESS SERVICE CO., LTD.) having SUS325 mesh (28 mm in diameter, 41 μm in aperture) was used. In a pattern of the screen plate, the width of its wiring (line) was 250 μm (design value of screen plate), wiring interval (line interval) was 400 μm and wiring length was 90 mm.

Subsequently, using a normal temperature bath, after the substrate was heated at 150° C. for 30 minutes so as to volatilize solvent, it was transferred to a sintering furnace at a sintering temperature of 500° C. and sintered for 30 minutes by heating. After the sintering, a film thickness was measured with a surface roughness measuring device (manufactured by TOKYO SEIMITSU KABUSHIKI KAISHA, SURFCOM130A).

The printability of each conductive paste was evaluated. More specifically, any fault such as thin spot, blur in the above screen printing was observed visually. As for evaluation index, ○: no fault and ×: fault found.

Comparative Example 1

The same operation as Example 1 was carried out except that solution of which the organic vehicle resin content density was 20 wt % was produced so as to produce conductive paste and wiring, and execute respective evaluations. No abnormality on appearance in normal condition was observed in the produced conductive pastes. The total amount of the contents of silver powder and glass frit with respect to the entire conductive paste was 91 wt %. As the result of measuring with an automatic specific surface area measuring device (manufactured by MALVERN, GEMINI 2375), the BET specific surface area of the used silver powder was 0.3 m$^2$/g. As the result of calculating according to "Metallic powders—Determination of tap density" of ISO 3953-1985(E), the tap density of the used silver powder was 5.0 g/cm$^3$.

Comparative Example 2

In the same way as Example 1 except that as organic vehicle, ethyl cellulose having a molecular wt of 15000 was dissolved in diethylene glycol monoethyl ether acetate by heating so as to prepare a solution of which the resin content density was 10 wt %, conductive paste and wiring were produced and respective evaluations were executed. No abnormality on appearance in normal condition was observed in the produced conductive pastes. The total amount of the contents of silver powder and glass frit with respect to the entire conductive paste was 83 wt %. As the result of measuring with an automatic specific surface area measuring device (manufactured by MALVERN, GEMINI 2375), the BET specific surface area of the used silver powder was 0.3 m$^2$/g. According to "Metallic powders—Determination of tap density" of ISO 3953-1985(E), the tap density of the used silver powder was calculated to be 5.0 g/cm$^3$.

Comparative Example 3

In the same way as Example 3 except that silver powder of the kind and quantity shown in Table 1 was used, conductive paste was produced. In this Comparative Example, the film forming properties of conductive paste were evaluated to be not acceptable according to the above-described evaluation method. That is, the viscosity was excessively high and the discharging performance of conductive paste dropped, so that no film was formed. Thus, the respective evaluations described in example 1 could not be executed. The total amount of the contents of silver powder and glass frit with respect to the entire conductive paste was 91 wt %. As the result of measuring with an automatic specific surface area measuring device (manufactured by MALVERN, GEMINI 2375), the BET specific surface area of the used silver powder was 2.4 m$^2$/g. According to "Metallic powders—Determination of tap density" of ISO 3953-1985(E), the tap density of the used silver powder was calculated to be 1.6 g/cm$^3$. The above results are shown in Table 1.

TABLE 1

|  |  |  | Example 1 | Example 2 | Example 3 | Example 4 | Example 5 | Comparison Example 1 | Comparison Example 2 | Comparison Example 3 |
|---|---|---|---|---|---|---|---|---|---|---|
| Composition | Organic Vehicle | Resin A *1 | 0.6 | 0.8 | 1.0 | 0.8 | 0.8 | 2.0 | 2.0 | 1.0 |
|  |  | Solvent *2 | 9.4 | 9.2 | 9.0 | 9.2 | 9.2 | 8.0 | 18.0 | 9.0 |
|  | Silver Powder | Silver Particle *3 | 100 | 100 | 100 | 50 | 47.5 | 100 | 100 | — |
|  |  | Silver Particle *4 | — | — | — | 50 | 47.5 | — | — | — |

TABLE 1-continued

|  |  |  | Example 1 | Example 2 | Example 3 | Example 4 | Example 5 | Comparison Example 1 | Comparison Example 2 | Comparison Example 3 |
|---|---|---|---|---|---|---|---|---|---|---|
|  |  | Silver Particle *5 | — | — | — | — | — | — | — | 100 |
|  |  | Silver Particle *6 | — | — | — | — | 5 | — | — | — |
|  | Glass Frit (Non-lead) | Sample A *7 | 0.5 | 0.5 | 0.5 | 0.5 | 0.5 | 0.5 | 0.5 | 0.5 |
|  | Content of Silver Powder and Glass Frit with respect to Entire Conductive Paste (%) |  | 91 | 91 | 91 | 91 | 91 | 91 | 83 | 91 |
| Characteristics | Characteristics of Silver Powder | Tap Density (g/cm³) | 5.0 | 5.0 | 5.0 | 5.2 | 5.2 | 5.0 | 5.0 | 1.6 |
|  |  | BET Specific Surface Area (m²/g) | 0.3 | 0.3 | 0.3 | 1.1 | 1.1 | 0.3 | 0.3 | 2.4 |
|  |  | 5-BET Specific Surface Area | 4.7 | 4.7 | 4.7 | 3.9 | 3.9 | 4.7 | 4.7 | 2.6 |
|  | Film Forming Property |  | ○ | ○ | ○ | ○ | ○ | ○ | ○ | *8 |
|  | Viscosity (Pa·s) | 1 rpm | 124 | 167 | 231 | 216 | 224 | 452 | 72 | *9 |
|  | Contraction Percentage (%) | When drying | 42 | 44 | 47 | 43 | 45 | 45 | 59 |  |
|  |  | When sintering | 61 | 60 | 62 | 61 | 60 | 60 | 68 |  |
|  | Film Thickness (μm) |  | 41.2 | 42.8 | 38.8 | 39.2 | 43.0 | 42.8 | 31.6 |  |
|  | Volume Resistivity | Sintering Temperature 500° C. | 3.2 | 3.2 | 3.2 | 2.8 | 2.1 | 3.2 | 3.2 |  |
|  | Evaluation of Screen Printing | Wiring Width (μm) | 320 | 304 | 296 | 292 | 291 | 260 | 360 |  |
|  |  | Film Thickness (μm) | 32.4 | 33.6 | 32.0 | 30.6 | 30.2 | 22.4 | 12.4 |  |
|  |  | Printability | ○ | ○ | ○ | ○ | ○ | X | X |  |

*1: Ethyl Cellulose (MW; 15000)
*2: Diethylene Glycol Monoethyl Ether Acetate
*3: Substantially Spherical, Average Particle Diameter; 2.6 μm Tap Density; 5.0 g/cm³, BET Specific Surface Area; 0.3 m²/g
*4: Substantially Spherical, Average Particle Diameter; 0.5 μm Tap Density; 5.0 g/cm³, BET Specific Surface Area; 1.9 m²/g
*5: Substantially Spherical, Average Particle Diameter; 0.3 μm, Tap Density; 1.6 g/cm³, BET Specific Surface Area; 2.4 m²/g
*6: Spherical, Average Particle Diameter; 30 nm, BET Specific Surface Area; 5.7 m²/g
*7: Average Particle Diameter; 1.5 μm, Point of Operation; 475° C.
*8: No Film Formed
*9: Unmeasurable In Examples 1-5, in which the total amount of contents of silver powder and glass frit with respect to the entire conductive paste was 90 wt % or more and the viscosity at a rotational speed of 1 rpm was 100 Pa·s or more to 400 Pa·s or less, contraction of applied film at the time of drying and sintering of conductive paste was suppressed. Further, when a wiring pattern was formed by screen printing, the printability of the conductive paste was excellent and the conductive paste could be applied thick at a thickness of 30 μm-35 μm. Further, the volume resistance was $3.2 \times 10^6$ μΩ·cm or less. That is, the examples 1-5 showed high conductive properties.

On the other hand, Comparative Example 1, in which ethyl cellulose as organic vehicle resin component was increased, suppressed contraction of applied film at the time of drying and sintering of conductive paste effectively, and showed a high conductive property. However, since the viscosity at a rotational speed of 1 rpm exceeded 400 Pa·s, the discharging performance of the conductive paste when wiring pattern was formed dropped, so that the conductive paste could not be applied thick. The reason is considered to be that the viscosity of conductive paste was raised by increase of ethyl cellulose.

Comparative Example 2 also suppressed contraction of applied film at the time of drying and sintering of conductive paste effectively, and showed a high conductive property. However, since the viscosity at a rotational speed of 1 rpm was less than 100 Pa·s, the viscosity of conductive paste at the time of formation of the wiring pattern was excessively low, so that the applied conductive paste was likely to droop down. As a result, conductive paste could not be applied thickly. The reason is believed to be because that the total amount of content of silver powder and glass frit with respect to the entire conductive paste was smaller than in examples 1-5.

In Examples 1-5, in which the tap density of metal powder satisfies the relationship of tap density ≧5-BET, when the wiring pattern is formed by screen printing, the printability of the conductive paste is excellent and the conductive paste can be applied thick at a thickness of 30 μm-35 μm. Further, it is indicated that the contraction of the applied film at the time of drying and sintering can be suppressed without any drop in printability of the conductive paste.

On the other hand, in Comparative Example 3, in which the tap density of metal powder did not satisfy the relationship of tap density ≧5-BET, the film forming characteristic of the conductive paste was evaluated to be poor. The reason is estimated to be that since the used silver powder was all of substantially spherical particles having an average particle diameter of 30 nm, the tap density was excessively low 1.6 (g/cm³), so that rise in viscosity of conductive paste was not suppressed.

Example 5, in which the silver powder contained substantially spherical particles of which the primary particle average particle diameter was 30 nm and the blend quantity of the substantially spherical particles was 5 wt % with respect to the entire metal powder, showed a higher silver powder packing density than in Example 4, in which no substantially spherical particles were used. Consequently, it is apparent that conductive properties at a low sintering temperature (450° C.) can be improved.

The invention claimed is:

1. A conductive paste comprising: a metal powder, a glass frit, and an organic vehicle, wherein the total amount of content of the metal powder and the glass frit with respect to the entire conductive paste is 85 wt % or more, and the viscosity at a rotational speed of 1 rpm measured at 25° C. with an E type rotating viscometer is 100 Pa·s or more and 400 Pa·s or less, and a BET specific surface area of the metal powder is 0.3 m²/g or more and 1.1 m²/g or less.

2. The conductive paste according to claim 1, wherein the total amount of content of the metal powder and the glass frit with respect to the entire conductive paste is 90 wt % or more.

3. The conductive paste according to claim 1, wherein when the BET specific surface area (m²/g) of the metal powder is expressed as BET, the BET and the tap density (g/cm³) of the metal powder satisfy a relationship of tap density ≧5-BET.

4. The conductive paste according to claim 1, wherein the metal powder contains substantially spherical particles of which the primary particle average particle diameter is 50 nm or less, and has a blend quantity of the substantially spherical particles of 1-50 wt % with respect to the entire metal powder.

5. The conductive paste according to claim 1, wherein the metal powder is of one or more kinds selected from platinum, gold, silver, copper, nickel, and palladium, or an alloy of one or more of the listed metals and other metal.

6. The conductive paste according to claim 1, wherein the organic vehicle is constituted of a solvent having a boiling point of 200° C. or higher, and a resin soluble in the solvent.

7. A wiring board comprising a substrate and wiring, the wiring being formed on the substrate by printing the conductive paste according to claim 1.

8. The wiring board according to claim 7, wherein the thickness of the wiring is 25 μm or more.

* * * * *